(12) United States Patent
Hasegawa et al.

(10) Patent No.: US 8,575,481 B2
(45) Date of Patent: Nov. 5, 2013

(54) ELECTRONIC APPARATUS STORING CONTAINER AND METHOD FOR ASSEMBLING ELECTRONIC APPARATUS STORING CONTAINER

(75) Inventors: Masashi Hasegawa, Tokyo (JP); Naoto Ozaki, Tokyo (JP); Katsuya Hirano, Tokyo (JP)

(73) Assignee: NEC Corporation, Tokyo (JP)

( * ) Notice: Subject to any disclaimer, the term of this patent is extended or adjusted under 35 U.S.C. 154(b) by 173 days.

(21) Appl. No.: 13/132,487

(22) PCT Filed: Oct. 15, 2009

(86) PCT No.: PCT/JP2009/005387
§ 371 (c)(1),
(2), (4) Date: Jun. 2, 2011

(87) PCT Pub. No.: WO2010/070796
PCT Pub. Date: Jun. 24, 2010

(65) Prior Publication Data
US 2011/0240327 A1   Oct. 6, 2011

(30) Foreign Application Priority Data
Dec. 18, 2008  (JP) .................................. 2008-321953

(51) Int. Cl.
*H01J 5/00*  (2006.01)
(52) U.S. Cl.
USPC ...................... 174/50.51; 174/50.5; 174/50.54
(58) Field of Classification Search
USPC .................. 361/703, 710, 715, 831; 257/722; 165/185, 80.3; 174/50.5, 50.51, 50.54
See application file for complete search history.

(56) References Cited

U.S. PATENT DOCUMENTS 5,636,101 A * 6/1997 Bonsall et al. ............ 361/679.27
7,040,383 B2 * 5/2006 Oyamada ................. 165/104.33

FOREIGN PATENT DOCUMENTS

| JP | 2-118980 A | 9/1990 |
| JP | 6-459 A | 1/1994 |
| JP | 10-22900 A | 1/1998 |
| JP | 11-121941 A | 4/1999 |
| JP | 2001237577 A | 8/2001 |
| JP | 2003188569 A | 7/2003 |
| JP | 2004063785 A | 2/2004 |
| JP | 2006032581 A | 2/2006 |

OTHER PUBLICATIONS

International Search Report for PCT/JP2009/005387 mailed Nov. 10, 2009.

* cited by examiner

*Primary Examiner* — Hoa C Nguyen
*Assistant Examiner* — Binh Tran

(57) ABSTRACT

The present invention has an object of providing an electronic apparatus storing container capable of facilitating mounting of an electronic apparatus and having improved productivity. The electronic apparatus storing container according to the present invention includes: a base including an electronic apparatus mounting area of a planar shape in which an electronic apparatus is mountable, and a packing groove formed in an outer peripheral portion of the electronic apparatus mounting area; a waterproof packing fit in a corresponding manner in the packing groove; and a case joined with the base with the waterproof packing sandwiched therebetween, the case storing the electronic apparatus mounted in the electronic apparatus mounting area. This improves the productivity of the electronic apparatus storing container.

6 Claims, 2 Drawing Sheets

ELECTRONIC APPARATUS STORING CONTAINER AND METHOD FOR ASSEMBLING ELECTRONIC APPARATUS STORING CONTAINER

TECHNICAL FIELD

The present invention relates to an electronic apparatus storing container with improved assemblability, and to a method for assembling the same.

BACKGROUND ART

In a cellular phone system, base station apparatuses are installed outdoors in each area of a predetermined size and radio communications are performed. Along with an increase in the number of subscribers, the number of base station apparatuses to be installed is expected to increase. Therefore, there is a demand for improvement in productivity and reduction in size and weight of the apparatuses.

For example, a base station unit for a cellular phone disclosed in Patent Literature 1 has a structure in which a plurality of casing pieces are joined together and a plurality of shield packings intervene at each joint between the casing pieces, thereby forming a base station apparatus for a cellular phone.

Patent Literature 2 discloses a base plate having a groove for forming an O-ring at the periphery thereof.

Patent Literature 3 discloses an electronic apparatus storing container in which an electronic apparatus is installed at the center of a flat substrate and is covered with the container surrounded by a wire gauge.

Patent Literature 4 discloses an electronic apparatus storing container having a full-face-type cover which is formed in a box shape by welding a plate.

Patent Literature 5 discloses a base station apparatus which includes a cover and a groove formed along an edge of an opening, and in which a packing is formed in the groove.

CITATION LIST

Patent Literature
[Patent Literature 1] Japanese Unexamined Patent Application Publication No. 10-022900
[Patent Literature 2] Japanese Examined Utility Model Application Publication No. 06-000459
[Patent Literature 3] Japanese Unexamined Utility Model Application Publication No. 02-118980
[Patent Literature 4] Japanese Unexamined Patent Application Publication No. 2006-032581
[Patent Literature 5] Japanese Unexamined Patent Application Publication No. 11-121941

SUMMARY OF INVENTION

Technical Problem

However, in the base station apparatus disclosed in Patent Literature 1, a plurality of casing pieces are joined together and a plurality of shield packings intervene at each joint between the casing pieces, thereby forming a base station unit for a cellular phone. Thus, it takes a long time to assemble the apparatus, leading to deterioration in productivity.

Additionally, since the plurality of casing pieces are joined together and a radiator fin is mounted on each casing, resulting in an increase in the occupied volume of the apparatus.

Moreover, in the technique disclosed in Patent Literature 2, a sealing surface is disposed at a higher position than an electronic apparatus installation part, and a substrate has a container shape (concave shape). This makes it difficult to mount a circuit module, such as a circuit substrate, upon downsizing, for example.

The present invention has been made in view of the above-mentioned problems and has an object of providing an electronic apparatus storing container with improved productivity.

Solution to Problem

In order to solve the above-mentioned problems, an electronic apparatus storing container according to the present invention includes: a base including an electronic apparatus mounting area of a planar shape in which an electronic apparatus is mountable, and a packing groove formed in an outer peripheral portion of the electronic apparatus mounting area; a waterproof packing fit in a corresponding manner in the packing groove; and a case joined with the base with the waterproof packing sandwiched therebetween, the case storing the electronic apparatus mounted in the electronic apparatus mounting area.

A method for assembling an electronic apparatus storing container according to the present invention includes: screwing an electronic apparatus into an electronic apparatus mounting area of a planar shape; fitting a waterproof packing in a packing groove in a corresponding ma, the packing groove being formed in an outer peripheral portion of the electronic apparatus mounting area; and screwing a case and a base with the waterproof packing sandwiched therebetween, the case storing the electronic apparatus.

Advantageous Effects of Invention

According to the present invention, a packing groove is formed in the outer periphery of a planar base plate, thereby facilitating mounting of an electronic apparatus, improving the productivity, and achieving downsizing.

DESCRIPTION OF EMBODIMENTS

An exemplary embodiment of the present invention will now be described in detail with reference to the drawings.

Figure 1:
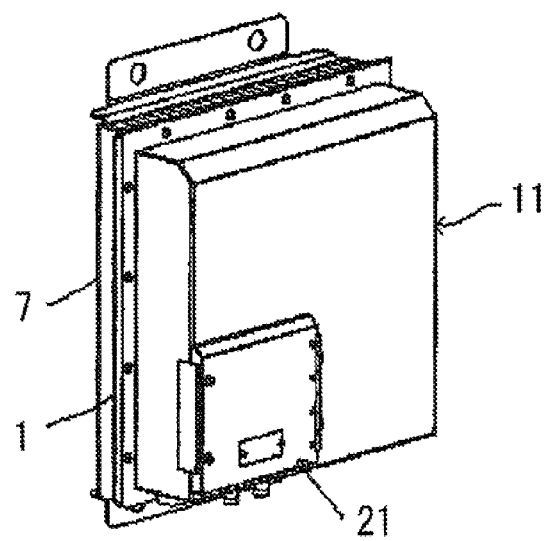
FIG. 1 is a perspective view showing an external appearance of a base station apparatus according to an exemplary embodiment.
Figure 2:
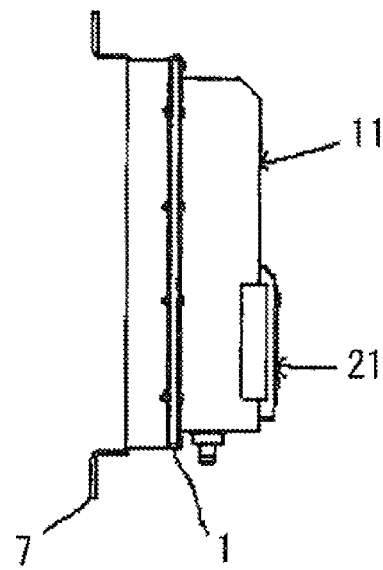
FIG. 2 is a side view showing an external appearance of the base station apparatus according to an exemplary embodiment.
Figure 3:
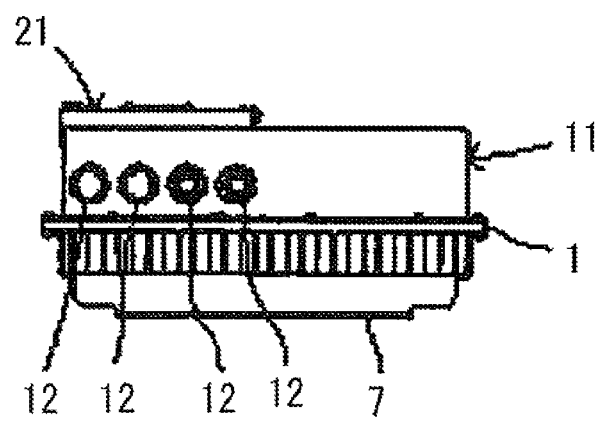
FIG. 3 is a bottom view showing an external appearance of the base station apparatus according to an exemplary embodiment.

FIG. 1 is a perspective view showing an external appearance of a base station apparatus according to an exemplary embodiment of the present invention. FIG. 2 is a side view of the apparatus. FIG. 3 is a bottom view of the apparatus. FIG.

Figure 5:
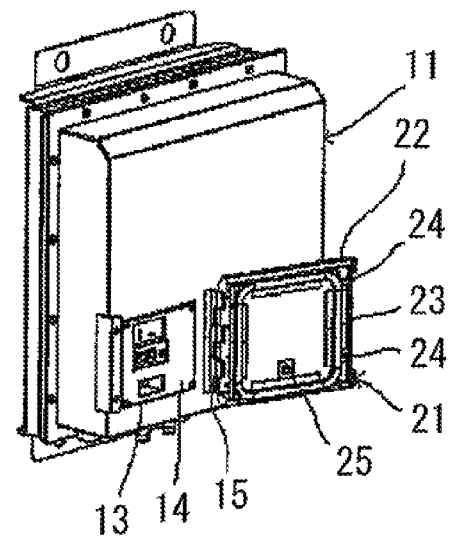
FIG. 5 is a view showing a state where a maintenance door of the base station apparatus according to an exemplary embodiment is opened.

4 is an exploded perspective view of the apparatus. FIG. 5 is a view showing a state where a maintenance door of the apparatus is opened.

As shown in FIGS. 1 and 2, the base station apparatus includes a base plate 1, a fitting 7, a case 11, and a maintenance door 21.

A shown in FIG. 3, connectors 12 for connecting with an antenna (not shown) and for supplying power are provided on the bottom surface of the case 11.

A base plate 1 includes radiator fins 3 which are formed on the side of the fitting 7, and a base plane 2 which is formed on the opposite surface side and has a planar shape. The base plane 2 is an area for mounting an electronic circuit unit 6 functioning as a base station. Further, at the outer periphery of the base plane 2 of a planar shape, a packing groove 4 is formed in which a waterproof packing 5 is embedded. The base has a planar shape and the packing groove is formed in the outer periphery thereof. This structure makes it possible to smoothly mount the electronic circuit unit upon downsizing of the apparatus.

When the waterproof packing 5 is inserted into the packing groove 4, the waterproof packing 5 has an annular shape with a size slightly larger than the base plane 2. When the case 11 is screwed into the base plate 1, protruding portions are crushed, thereby maintaining the waterproof property of each of the base plate 1 and the case 11.

In the electronic circuit unit 6 which is directly screwed into the base plane 2 of the base plate 1, heat generated inside is transferred to the base plate 1 and is effectively radiated from the radiator fins 3 which are provided on the opposite surface side of the base plate 2.

The case 11 has a size capable of storing the electronic circuit unit 6. The case 11 is joined by being screwed into the base plate 1 with the waterproof packing 5 sandwiched therebetween. Accordingly, the base station apparatus has a waterproof function to prevent water from entering the inside of the apparatus from a gap between joint surfaces of the base plate 1 and the case 11. Note that it is preferable that the case 11 be integrally formed by plate welding so as to protect the electronic circuit unit and prevent water from entering from the case 11.

Furthermore, a convex portion of the case 11 includes the maintenance door 21 and a maintenance window 13 for adjusting the electronic circuit unit 6 and checking the operating state, and a hinge 15 for mounting the maintenance door 21 is provided. A maintenance plate 14 is screwed into the maintenance window 13.

As specifically shown in FIG. 5, the maintenance door 21 is integrally formed by plate welding, and can be opened/closed through the hinge 15 mounted to the case 11. Normally, the maintenance door 21 is fixed to the case 11 by two screws for door 24. During adjustment or maintenance of the apparatus, the screws for door 24 are loosened to open the maintenance door 21. Note that the screws for door 24 are structured so as not to be dismounted from the maintenance door 21, thereby preventing the screws from being lost.

An upper portion of the maintenance door 21 includes a rod-like primary packing for door 22 for preventing water or the like dropping from the case 11 from entering, and an annular secondary packing for door 23 for preventing water or the like from entering the maintenance window 13. Further, a breathing hole 25 is provided so as to prevent a difference from occurring between the pressure within the apparatus and the outside atmospheric pressure. The breathing hole is provided with a micro-porous cap 26, such as Gore-Tex®, which has air permeability but is not permeable to water.

The fitting 7 for mounting the apparatus outdoors has mounting holes 8 and is fixed to the base plate 1 by screws.

Next, a procedure for assembling the base station apparatus will be described in detail. When the assembly is carried out in accordance with this procedure, the base station apparatus with improved productivity (the assemblability of the apparatus is improved) and having a small occupied volume is obtained. Note that the electronic circuit unit 6 is assembled in a separate process and prepared as a finished product.

In assembly of the maintenance door 21, the primary packing for door 22 and the secondary packing for door 23 are fixed to the inside of the maintenance door 21 with an adhesive. Further, the two door fixing screws 24 are mounted in the maintenance door 21. After that, the maintenance door 21 is fixed by screws to the hinge 15 which is mounted to the case 11.

In assembly of the case 11, the connectors 12 for connecting with an antenna (not shown) and supplying power are mounted to a lower surface of the case 11. Note that the connectors 12 have a waterproof structure, which prevents water from entering from the lower surface of the case 11.

The connectors 12 are each attached with a wire for connecting with the electronic circuit unit 6 and a connection connector (not shown). Thus, there is a possibility that the wire and the connection connector are sandwiched when the case 11 is screwed into the base plate 1. To prevent this, the leading ends of the wire and the connection connector are drawn out of the maintenance window 13 in the state where the maintenance plate 14 is dismounted. Further, the hinge 15 is fixed by screws, and then the maintenance door 21 is mounted to the hinge 15.

Figure 4:
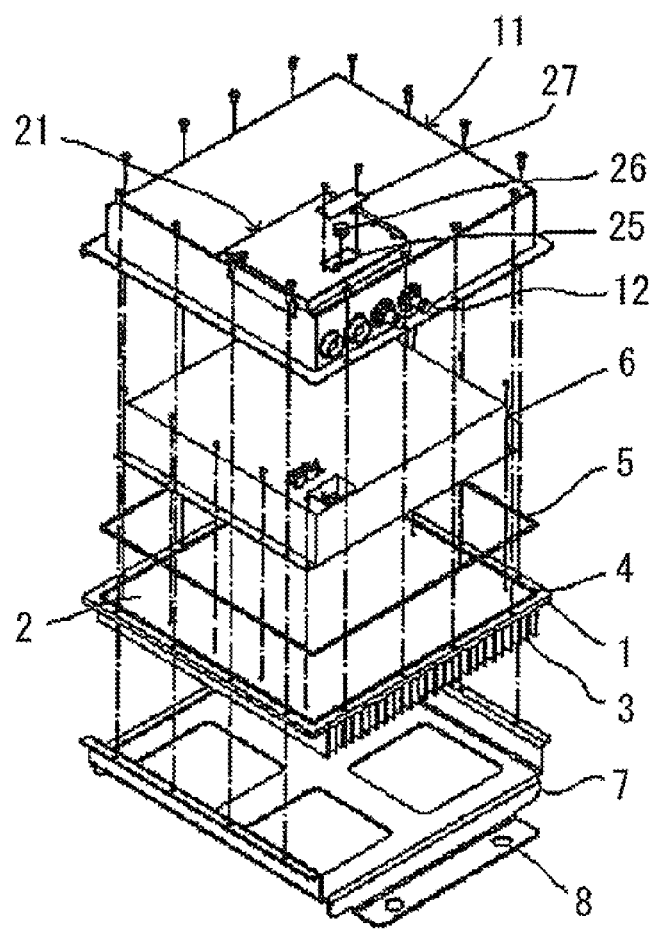
FIG. 4 is an exploded perspective view of the base station apparatus according to an exemplary embodiment.

Thus, preparation of each unit is finished, and then the apparatus main body is assembled. Note that when the apparatus is installed outdoors, the apparatus is installed vertically as shown in FIG. 1. Meanwhile, during assembly, the apparatus can be installed horizontally as shown in FIG. 4 so that the screwing operation can be performed from one direction, thereby facilitating the assembly work.

First, the base plate 1 is placed on the fitting 7. Next, the electronic circuit unit 6 is screwed into the base plane 2. Then, the waterproof packing 5 is inserted into the packing groove 4 of the base plate 1. The case 11 is placed on the base plate 1, and then the case 11, the base plate 1, and the fitting 7 are fixed by screws. The connection connector drawn out of the maintenance window 13 is connected to the electronic circuit unit 6, and then the maintenance plate 14 is fixed by screws. After that, the maintenance door 21 is closed and fixe by the two screws for door 24.

The present invention has been described above with reference to exemplary embodiments. The present invention has been described by way of specific examples, but these specific examples can be modified or changed in various manners without departing from the wide spirit and scope of the present invention as defined in the claims.

This application is the National Phase of PCT/JP2009/005387, filed Oct. 15, 2009, which is based upon and claims the benefit of priority from Japanese patent application No. 2008-321953, filed on Dec. 18, 2008, the disclosure of which is incorporated herein in its entirety by reference.

REFERENCE SIGNS LIST

1 BASE PLATE
2 BASE PLANE
3 RADIATOR FIN
4 PACKING GROOVE
5 WATERPROOF PACKING

6 ELECTRONIC CIRCUIT UNIT
7 FITTING
8 MOUNTING HOLE
11 CASE
12 CONNECTOR
13 MAINTENANCE WINDOW
14 MAINTENANCE PLATE
15 HINGE
21 MAINTENANCE DOOR
22 PRIMARY PACKING FOR DOOR
23 SECONDARY PACKING FOR DOOR
24 SCREW FOR DOOR
25 BREATHING HOLE
26 MICROPOROUS CAP
27 BREATHING HOLE COVER

The invention claimed is:

1. An electronic apparatus storing container comprising:
a base including an electronic apparatus mounting area of a planar shape in which an electronic apparatus is mountable, and a packing groove formed in an outer peripheral portion of the electronic apparatus mounting area;
a waterproof packing fit in a corresponding manner in the packing groove; and
a case joined with the base with the waterproof packing sandwiched therebetween, the case storing the electronic apparatus mounted in the electronic apparatus mounting area;
a door including a hole part, the door being openable and closable to the case;
a micro-porous cap fit in the hole part, the cap being permeable to air and impermeable to water; and
a hole-part cover provided on an outer surface of the door, the hole-part cover covering the hole part.

2. The electronic apparatus storing container according to claim 1, wherein the electronic apparatus is mounted substantially at the center of the electronic apparatus mounting area.

3. The electronic apparatus storing container according to claim 1 wherein the case is integrally formed by plate welding.

4. The electronic apparatus storing container according to claim 1, wherein the door includes a waterproof packing for preventing water from entering.

5. The electronic apparatus storing container according to claim 1, wherein the base includes a radiator fin on a surface opposed to the electronic apparatus mounting area.

6. A method for assembling an electronic apparatus storing container, the method comprising:
screwing an electronic apparatus into an electronic apparatus mounting area of a planar shape;
fitting a waterproof packing in a packing groove in a corresponding manner, the packing groove being formed in an outer peripheral portion of the electronic apparatus mounting area; and
screwing a case and a base with the waterproof packing sandwiched therebetween, the case storing the electronic apparatus;
forming a hole part in a door;
fitting a micro-porous cap into the hole part, the cap being permeable to air and impermeable to water;
attaching a hole-part cover on an outer surface of the door, the hole-part cover covering the hole part; and
attaching the door to the case, the door being openable and closeable to the case.

\* \* \* \* \*